(12) United States Patent
Lee et al.

(10) Patent No.: US 8,980,528 B2
(45) Date of Patent: Mar. 17, 2015

(54) PHOTORESIST COMPOSITION AND METHOD OF FORMING A BLACK MATRIX USING THE SAME

(71) Applicant: Samsung Display Co., Ltd., Yongin, Gyeonggi-Do (KR)

(72) Inventors: Ki-Beom Lee, Seoul (KR); Chang-Hoon Kim, Chungcheongnam-do (KR); Su-Yeon Sim, Gyeongsangnam-do (KR); Sang-Hyn Lee, Gyeonggi-do (KR); Hi-Kuk Lee, Gyeonggi-do (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/765,132

(22) Filed: Feb. 12, 2013

(65) Prior Publication Data

US 2014/0045121 A1    Feb. 13, 2014

(30) Foreign Application Priority Data

Aug. 9, 2012 (KR) .......................... 10-2012-0087188

(51) Int. Cl.
*G03F 7/004* (2006.01)
*G03F 7/033* (2006.01)
*G03F 7/032* (2006.01)
*G03F 7/20* (2006.01)
*G03F 7/028* (2006.01)

(52) U.S. Cl.
CPC ............... *G03F 7/033* (2013.01); *G03F 7/032* (2013.01); *G03F 7/2051* (2013.01); *G03F 7/028* (2013.01); *G03F 7/20* (2013.01)
USPC ...................................................... 430/270.1

(58) Field of Classification Search
None
See application file for complete search history.

(56) References Cited

U.S. PATENT DOCUMENTS

| | | | | |
|---|---|---|---|---|
| 2009/0280416 A1* | 11/2009 | Einaga et al. | ...................... | 430/7 |
| 2010/0103548 A1* | 4/2010 | Kim et al. | ...................... | 359/885 |
| 2010/0163811 A1* | 7/2010 | Oh et al. | ........................ | 252/586 |
| 2011/0117498 A1* | 5/2011 | Han et al. | .................... | 430/280.1 |
| 2011/0151379 A1* | 6/2011 | Choi et al. | ................. | 430/270.1 |

FOREIGN PATENT DOCUMENTS

| | | | |
|---|---|---|---|
| JP | 2007078892 A | * | 3/2007 |
| JP | 2010122381 | | 3/2010 |
| KR | 100367472 | | 12/2002 |
| KR | 100671106 | | 1/2007 |

OTHER PUBLICATIONS

Machine translation JP 2007-078892. Mar. 29, 2007.*

* cited by examiner

*Primary Examiner* — Cynthia H Kelly
*Assistant Examiner* — Alyssa L Cepluch
(74) *Attorney, Agent, or Firm* — Cantor Colburn LLP (57) ABSTRACT

A photoresist composition including: about 5% by weight to about 10% by weight of a binder resin; about 5% by weight to about 10% by weight of a photo-polymerization monomer; about 1% by weight to about 5% by weight of a photo initiator, which is activated by a light having a peak wavelength from about 400 nm to about 410 nm; about 5% by weight to about 10% by weight of a black-coloring agent, each based on a total weight of the photoresist composition; and a solvent.

12 Claims, 4 Drawing Sheets

PHOTORESIST COMPOSITION AND METHOD OF FORMING A BLACK MATRIX USING THE SAME

This application claims priority to and the benefit of Korean Patent Application No. 10-2012-0087188, filed on Aug. 9, 2012, and all the benefits accruing therefrom under 35 U.S.C. §119, the content of which is incorporated in its entirety by reference for all purposes as if fully set forth herein.

BACKGROUND

1. Field

Embodiments of the present disclosure relate to a photoresist composition and a method of forming a black matrix using the photoresist composition. More particularly, embodiments of the present disclosure relate to a photoresist composition, which may be used for a digital light-exposure device, and a method of forming a black matrix using the photoresist composition.

2. Description of the Related Art

Generally, a photoresist pattern may be formed from a coated layer formed by coating a photoresist composition on a base substrate, and exposing the coated layer to light and developing the coated layer. In the process of exposing the coated layer to light, a mask may be used to determine a shape of the photoresist pattern. The photoresist pattern may, for example, be an etch stop pattern for patterning a layer disposed under a photoresist pattern, an insulation layer, a color filter, a black matrix, or the like.

Changing a design of a photoresist pattern may involve changing a mask design thereof. Since the manufacturing cost of a mask may be high, using more masks may increase the manufacturing cost of the display device.

Recently, this problem has been addressed by implementing a digital light-exposure device which uses micro-minors to form a photoresist pattern without using a mask. The micro-mirrors may provide a plurality of spot beams onto the photoresist layer to form a photoresist pattern.

However, since the digital light-exposure device may utilize a light source emitting a light having a different peak wavelength than a conventional exposure apparatus configured for use with a mask, a conventional photoresist composition may have a lower photosensitivity with respect to the light emitted by the digital light-exposure device. As a result, when the conventional photoresist composition is used with the digital light-exposure device, manufacturing reliability of a photoresist pattern may be decreased. Thus, there is an unmet need in developing a photoresist composition which provides improved sensitivity and resolution when used with a digital light-exposure device.

SUMMARY

An exemplary embodiment provides a photoresist composition with improved sensitivity and resolution to a light source of a digital light-exposure device.

An exemplary embodiment also provides a method of forming a black matrix using the photoresist composition.

An exemplary embodiment provides a photoresist composition including about 5% by weight to about 10% by weight of a binder resin; about 5% by weight to about 10% by weight of a photo-polymerization monomer; about 1% by weight to about 5% by weight of a photo initiator, which is activated by a light having a peak wavelength from about 400 nanometers ("nm") to about 410 nm; about 5% by weight to about 10% by weight of a black-coloring agent, each based on a total weight of the photoresist composition; and a solvent.

In an embodiment, the binder resin includes an acrylic resin and a cardo resin.

In an embodiment, a weight-average molecular weight of the acrylic resin is about 3,000 to about 50,000 Daltons ("Da"), and the acrylic resin is a product of polymerization of at least one selected from methacrylic acid, acrylic acid, crotonic acid, maleic acid, vinyl pyrrolidone, styrene monomer, methyl methacrylate, benzyl methacrylate, 2-hydroxyethyl methacrylate, an aryl methacrylate, and glycidyl methacrylate.

In an embodiment, a weight-average molecular weight of the cardo resin is about 3,000 to about 10,000 Da, and the cardo resin includes a ring structure represented by the following Chemical Formula 1.

Chemical Formula 1 wherein "*" represents a point of attachment to the neighboring groups of the cardo resin.

In an embodiment, a weight ratio of the cardo resin to the acrylic resin is about 8:2 to about 5:5.

In an embodiment, the photo-polymerization monomer includes at least one selected from dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl) 4isocyanurate triacrylate, di-trimethylpropane tetraacrylate, dipentaerythritol pentaacrylate, pentaerythritol tetraacrylate, glycidyl methacrylate, hydroxyethyl methacrylate, 2-hydroxy-3-phenoxy propyl acrylate, diethylene glycol methyl ether methacrylate, hydroxyethyl acrylate, butyl methacrylate, hydroxypropylacrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate.

In an embodiment, the photo initiator includes at least one surficial-portion initiator selected from a bis(acyl)phosphine compound, a metallocene compound, a monoacylphosphine compound, and an α-hydroxyketone compound. Particularly, the photo initiator includes at least one selected from phenyl-bis(2,4,6-trimethylbenzoyl)phosphine oxide, diphenyl(2,4,6-trimethylbenzoyl)phosphine oxide, phenyl-bis(2,4,6-trimethylbenzoyl)phosphine oxide, 2-hydroxy-2-methyl-1-phenyl-1-propanone, and bis(η5-2,4-cyclopentadien-1-yl) bis[2,6-difluoro-3-(1H-pyrrol-1-yl)phenyl]titanium.

In an embodiment, the photo initiator further includes a deep-portion initiator including an acetophenone compound.

In an embodiment, a weight ratio of the at least one surficial-portion initiator to the deep-portion initiator is about 7:3 to about 5:5.

In an embodiment, the black-coloring agent includes at least one selected from carbon black, titanium black, acetylene black, aniline black, perylene black, strontium titanium oxide, chromium oxide, and ceria.

In an embodiment, the photoresist composition further includes equal to or less than about 1% by weight of a dispersing agent, based on a total weight of the photoresist composition.

In an embodiment, the photoresist composition further includes a sensitizer, wherein an amount of the sensitizer is about 10% by weight to about 30% by weight, based on a total weight of the photo initiator, and wherein the sensitizer includes at least one selected from diethylenethioxanthone, violanthrone, isoviolanthrone, fluorescine, rubrene, 9,10-diphenylanthracene, tetracene, 13,13"-dibenzanthrone, and levulinic acid.

In an embodiment, the photoresist composition further includes a wavelength shifter, wherein an amount of the wavelength shifter is equal to or less than about 50% by weight, based on a total weight of the photo initiator, and the wavelength shifter includes at least one selected from n-(2-phenyl-1,3-benzoxazol-5-yl)naphthalene-1-carboxamide and 7-(diethylamino)-4-(trifluoromethyl)-2H-chromen-2-one.

In an embodiment, the photoresist composition further includes an additive, wherein an amount of the additive is equal to or less than about 1% by weight, based on a total weight of the photoresist composition, and wherein the additive includes at least one selected from a surfactant and an adhesion enhancer.

An embodiment provides a method of forming a black matrix including disposing a photoresist composition on a base substrate to form a coated layer, wherein the photoresist composition includes about 5% by weight to about 10% by weight of a binder resin; about 5% by weight to about 10% by weight of a photo-polymerization monomer; about 1% by weight to about 5% by weight of a photo initiator, which is activated by a light having a peak wavelength from about 400 nm to about 410 nm; about 5% by weight to about 10% by weight of a black-coloring agent, each based on a total weight of the photoresist composition; and a solvent; exposing the coated layer to a light; and developing the coated layer to form a photoresist pattern and form the black matrix.

In an embodiment, the coated layer is directly exposed to a light, which is generated from a light source and does not pass through a mask.

According to an embodiment, the photoresist composition includes the photo initiator activatable by light having a peak wavelength range of an h-line from about 400 nm to about 410 nm. Optical characteristics with respect to an exposure apparatus including a light source emitting a light of h-line may be improved.

In another embodiment, the photoresist composition further includes the sensitizer and the wavelength shifter. Eduction of the photo initiator may be prevented, and a fine pattern may be formed.

In another embodiment, the photoresist composition further includes the cardo resin and the acrylic resin. A photoresist pattern having a taper angle proper for a black matrix may be formed.

In another embodiment, the photoresist composition further includes the surficial-portion initiator and the deep-portion initiator. Adhesion and reliability of a photoresist pattern may be improved.

BRIEF DESCRIPTION OF THE DRAWINGS

The accompanying drawings, which are included to provide a further understanding and are incorporated in and constitute a part of this specification, illustrate an embodiment, and together with the description serve to explain the principles of the disclosure. The above and other aspects, advantages and features of this disclosure will become more apparent by describing in further detail exemplary embodiments thereof with reference to the accompanying drawings, in which.

DETAILED DESCRIPTION

Exemplary embodiments will hereinafter be described in further detail with reference to the accompanying drawings, in which various embodiments are shown. This disclosure may, however, be embodied in many different forms and should not be construed as limited to the exemplary embodiments set forth herein. Accordingly, the embodiments are merely described below, by referring to the figures, to explain aspects of the present description. These embodiments are provided so that this disclosure will be thorough and complete, and will fully convey the scope of the claims to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a photoresist composition according to an exemplary embodiment of the present disclosure is described more fully, and a method of forming a black matrix according to an exemplary embodiment of the present disclosure is described more fully with reference to the accompanying drawings.

Photoresist Composition

A photoresist composition according to an exemplary embodiment may include a binder resin, a photo-polymerization monomer, a photo initiator, a black-coloring agent, and a solvent. The photoresist composition may further include at least one of a dispersing agent, a sensitizer, a wavelength shifter, and an additive.

Hereinafter, the above components of the photoresist composition will be respectively described in further detail.

(a) Binder Resin

The binder resin may include an acrylic resin. In an embodiment, the binder resin may further include a cardo resin. The binder resin may be soluble in an alkali solution.

A weight-average molecular weight of the acrylic resin may be from about 3,000 to about 50,000 Daltons (Da), specifically about 10,000 Da to about 40,000 Da. The molecular weight of the acrylic resin may be selected so that the photoresist composition may be stably coated on a substrate and have a suitable density.

The acrylic resin may be formed by polymerization of a corresponding monomer. Examples of the monomer forming the acrylic resin may include at least one selected from methacrylic acid, acrylic acid, crotonic acid, maleic acid, vinyl pyrrolidone, a styrene monomer, methyl methacrylate, benzyl methacrylate, 2-hydroxyethyl methacrylate, an aryl methacrylate (e.g., phenyl methacrylate), glycidyl methacrylate, and the like. These monomers may be used alone or in a combination thereof. Thus, the acrylic resin may be a copolymer formed by polymerization of at least two different monomers.

In the process of manufacturing the acrylic resin, a thermal initiator may be used for polymerization of the acrylic monomers. Examples of the thermal initiator may include 2,2'-azobis(2,4-dimethyl)valeronitrile. An amount of the thermal initiator may be about 5% by weight to about 20% by weight, based on the total weight of the composition for manufacturing the acrylic resin.

Furthermore, a polymerization inhibitor may be used for controlling a molecular weight of the acrylic resin. Examples of the inhibitor may include 4-hydroxybenzophenone. An amount of the inhibitor may be equal to or less than about 1% by weight, based on the total weight of the composition for manufacturing the acrylic resin.

In an embodiment, a molecular weight of the cardo resin may be less than a molecular weight of the acrylic resin. A weight-average molecular weight of the cardo resin may be from about 3,000 to about 10,000 Da, specifically about 5,000 Da to about 9,000 Da.

The cardo resin may include a fluorene group. For example, the cardo resin may include a ring structure represented by the following Chemical Formula 1.

Chemical Formula 1

In Chemical Formula 1, the symbol "*" represents a point of attachment to the neighboring groups of the cardo resin.

Particularly, the cardo resin may be represented by the following Chemical Formula 2.

Chemical Formula 2

In Chemical Formula 2, n represents a positive integer, and may be about 1 to about 1000, specifically about 2 to about 500, and X is represented by the following Chemical Formula 3.

Chemical Formula 3

Y represents a residue of at least one selected from maleic anhydride, succinic anhydride, cis-1,2,3,6-tetrahydrophthalic anhydride, 3,4,5,6-tetrahydrophthalic anhydride, phthalic anhydride, itaconic anhydride, 1,2,4-benzenetricarboxylic anhydride, methyl-tetrahydrophthalic anhydride, citraconic anhydride, 2,3-dimethylmaleic anhydride, 1-cyclopentene-1,2-dicarboxylic anhydride, cis-5-norbonene-endo-2,3-dicarboxylic anhydride, and 1,8-naphthalic anhydride.

Z represents a residue of at least one selected from 1,2,4,5-benzenetetracarboxylic dianhydride, 4,4'-biphthalic dianhydride, 3,3',4,4'-benzophenonetetracarboxylic dianhydride, pyromelitic dianhydride, 1,4,5,8-naphthalenetetracarboxylic dianhydride, 1,2,4,5-tetracarboxylic anhydride, methylnorbonene-2,3-dicarboxylic anhydride, 4,4'-[2,2,2-trifluoro-1-(trifluoromethyl)ethylidene]diphthalic anhydride, 4,4'-oxydiphthalic anhydride, and ethyleneglycol bis (anhydrotrimelitate).

A digital light-exposure device that may be used for photocuring the photoresist composition uses a light source which is different from that used in a conventional light-exposure device. Thus, when a photoresist composition including an acrylic resin as a binder resin is used for with the digital light-exposure device, a taper angle of a photoresist pattern may be undesirably increased or, an adhesion ability of the photoresist pattern may be reduced. When a taper angle of a photoresist pattern is undesirably increased, its light-blocking ability is reduced, resulting in a photoresist pattern which may not be appropriate for a black matrix. In contrast, when the photoresist composition according to an exemplary embodiment includes the cardo resin, an adhesion ability of a photoresist pattern may be increased and a photoresist pattern has a suitable taper angle.

In an embodiment, an amount of the cardo resin may be more than an amount of the acrylic resin. For example, a weight ratio of the cardo resin to the acrylic resin may be about 8:2 to about 5:5, specifically, about 7:3 to about 6:4.

When an amount of the binder resin is less than about 5% by weight, based on the total weight of the photoresist composition, the amount of the binder resin may be insufficient to provide a suitable coating. In addition, a shape stability of a coated layer formed by the photoresist composition may be low. Alternatively, when an amount of the binder resin is greater than about 10% by weight, based on the total weight of the photoresist composition, a viscosity of the photoresist composition may be increased, and a dispersibility in the solvent may be reduced. Thus, the photoresist composition wherein the amount of the binder resin is greater than about 10% by weight may not be coated uniformly on the substrate. Thus, an amount of the binder resin may be about 5% by weight to about 10% by weight, based on the total weight of the photoresist composition.

(b) Photo-Polymerization Monomer

The photoresist composition may further include a photo-polymerization monomer. The photo-polymerization monomer may contain a double bond, and it may react with a radical generated by the photo initiator. The photo-polymerization monomer may react with the binder resin or an adjacent photo-polymerization monomer to form a cross-linkage.

In an embodiment, the photo-polymerization monomer may contain an acrylate group. Examples of the photo-polymerization monomer may include a multi-functional monomer, a mono-functional monomer, or a combination of the multi-functional monomer and the mono-functional monomer.

The multi-functional monomer may comprise a plurality of acrylate residues. Examples of the multi-functional monomer may include at least one selected from dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethylpropane tetraacrylate, dipentaerythritol pentaacrylate, and pentaerythritol tetraacrylate, and the like. These can be used alone or in a combination thereof.

A mono-functional monomer may comprise a single acrylate residue. Examples of the mono-functional monomer may include at least one selected from glycidyl methacrylate, hydroxyethyl methacrylate, 2-hydroxy-3-phenoxypropyl acrylate, diethylene glycol methyl ether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate, and the like. These can be used alone or in combination thereof.

When an amount of the photo-polymerization monomer is less than about 5% by weight, based on the total weight of the photoresist composition, a binding strength of the composition may be weakened and a shape stability of a photoresist pattern may be reduced. When an amount of the monomer is greater than about 10% by weight, based on the total weight of the photoresist composition, photo margins may not be suitably tuned. Thus, an amount of the photo-polymerization monomer may be about 5% by weight to about 10% by weight, based on the total weight of the photoresist composition.

(c) Photo Initiator

The photoresist composition may further include a photo initiator. The photo initiator may include a compound activatable by a light having a peak wavelength range of an h-line, which is from about 400 nm to about 410 nm. The photo initiator generates a radical when it is irradiated with the light. A curing reaction of the photoresist composition may be initiated by the radical.

A digital light-exposure device used in an exposure process for the photoresist composition may use a light source providing a light having a peak wavelength range of the h-line, which may be about 405 nm. The photo initiator may have high absorbance with respect to the light having a peak wavelength range of the h-line. Thus, the photoresist composition may be appropriate for forming a photoresist pattern by using the digital light-exposure device.

Non-limiting examples of the photo initiator may include at least one selected from a bis(acyl)phosphine based compound, a metallocene based compound, a monoacylphosphine based compound, and an α-hydroxyketone based compound, and the like. These can be used alone or in a combination thereof.

Specifically, examples of the photo initiator may include phenyl bis(2,4,6-trimethylbenzoyl)phosphine oxide (IRGACURE 819, available from Ciba-Geigy, Switzerland,), diphenyl(2,4,6-trimethylbenzoyl)phosphine oxide (DAROCUR TPO, available from Ciba-Geigy, Switzerland,), phenyl-bis(2,4,6-trimethylbenzoyl)phosphine oxide (IRGACURE 2100, available from Ciba-Geigy, Switzerland,), 2-hydroxy-2-methyl-1-phenyl-1-propanone (DAROCUR 1173, available from Ciba-Geigy, Switzerland,), and bis(η5-2,4-cyclopentadien-1-yl)-bis[2,6-difluoro-3-(1H-pyrrol-1-yl)phenyl] titanium (IRGACURE 784, available from Ciba-Geigy, Switzerland,], and the like. These can be used alone or in a combination thereof.

The photo initiator may further include a deep-portion initiator. When a light is provided to a coated layer, a surface portion of the coated layer may be easily cured. However, since the light may not substantially reach a deep, e.g., inner, portion of the coated layer, wherein the deep portion is disposed under the surface portion, the deep portion may not be cured sufficiently, which may cause an increase of a skew or lift-off of the coated layer.

When the photo initiator further includes a deep-portion initiator, a skew may be reduced, and a reliability of the coated layer may be increased. Non-limiting examples of the deep-portion initiator may include an acetophenone based compound. Specifically, examples of the deep-portion initiator may include at least one selected from acetophenone, 2,2-dimethoxy-2-phenylacetophenone, 4'-ethoxyacetophenone, 3'-hydroxyacetophenone, 3-hydroxyacetophenone, and 4'-phenoxyacetophenone, and the like. These can be used alone or in a combination thereof.

The bis(acyl)phosphine based compound, the metallocene based compound, the monoacylphosphine based compound, and the α-hydroxyketone based compound, which are listed above as examples of a photo initiator, may also correspond to and be referred to as a surficial-portion initiator.

In an embodiment, an amount of the surficial-portion initiator may be greater than an amount of the deep-portion initiator. Specifically, a weight ratio of the surficial-portion initiator to the deep-portion initiator may be about 7:3 to about 5:5, specifically about 7:3 to about 6:4.

When an amount of the photo initiator is less than about 1% by weight, based on the total weight of the photoresist composition, reactivity of the photoresist composition with respect to irradiating light may be insufficient, and the photoreaction of the photoresist composition may be insufficient to cure the photoresist. When an amount of the photo initiator is greater than about 15% by weight, it may be difficult to control a rate of the photoreaction. Furthermore, a degree of photoconversion in a deep portion of the coated layer may be less than in a surface portion of the coated layer. Thus, an amount of the photo initiator in the photoresist composition may be about 1% by weight to about 15% by weight, based on the total weight of the photoresist composition. An amount of the photo initiator may be about 1% by weight to about 5% by weight, based on a total weight of the photoresist composition.

(d) Black-Coloring Agent

The photoresist composition according to an exemplary embodiment may further include a black-coloring agent so that a photoresist pattern formed from the photoresist composition may function as a black matrix.

Non-limiting examples of the black-coloring agent may include at least one selected from carbon black, titanium black, acetylene black, aniline black, perylene black, strontium titanium oxide, chromium oxide, and cerium oxide, e.g., ceria, and the like. These can be used alone or in a combination thereof. For example, a particle size of the black-coloring agent may be about 60 nm to about 120 nm, specifically, about 70 nm to about 110 nm, more specifically about 80 nm to 100 nm.

Alternatively, the black-coloring agent may include a black pigment such as BK9599 (available from Tokuchiki, Japan), or a black dye.

When an amount of the black-coloring agent is less than about 5% by weight, based on the total weight of the photoresist composition, an optical density of a coated layer may be insufficient so that the coated layer may not have a sufficient light-blocking ability. When an amount of the black-coloring agent is greater than about 10% by weight, curing of the photoresist composition may be difficult. Thus, an amount of the black-coloring agent may be about 5% by weight to about 10% by weight, based on the total weight of the photoresist composition.

(e) Solvent

The photoresist composition may further include a solvent. The solvent may disperse and/or solubilize the binder resin, the photo-polymerization monomer, the photo initiator, and the black-coloring agent to form a solution and/or a dispersion that may be coated on an object.

Non-limiting examples of the solvent may include at least one selected from propylene glycol monomethyl ether acetate, ethyl ethoxy propionate, cyclohexanone, dipropylene glycol monomethyl ether acetate, n-butylacetate, isobutyl acetate, ethylene glycol monomethyl acetate, ethylene glycol n-butyl acetate, diethylene glycol dimethyl ether, dipropylene glycol monomethyl acetate, diethylene glycol methyl ether, dipropylene glycol n-butyl ether, tripropylene glycol n-butyl ether, tripropylene glycol methyl ether, propylene glycol methyl ether acetate, propylene glycol diacetate, 3-ethoxy propionic acid methyl ester, methanol, ethanol, methyl cellosolve monomethyl ether, ethyl cellosolve acetate, diethylene glycol monomethyl ether, methylethyl ketone, 4-hydroxy-4-methyl-2-pentanone, and 2-hydroxy-2-methylproprionic acid ethyl ester, and the like. These can be used alone or in a combination thereof.

An amount of the solvent may be about 84% by weight to about 65% by weight, specifically about 82% by weight to about 67% by weight, more specifically about 80% by weight to about 69% by weight, based on a total weight of the photoresist composition. In an embodiment, an amount of the solvent is a remaining percentage of the photoresist composition, i.e. the difference between 100% and the sum of the amounts of the binder resin, the photo-polymerization monomer, the photo initiator, and the black-coloring agent. For example, an amount of the solvent may be about 65% by weight to about 74% by weight, based on the total weight of the photoresist composition, specifically, about 70% by weight based on the total weight of the photoresist composition.

(f) Dispersing Agent

The photoresist composition may further optionally include a pigment dispersing agent. While not wanting to be bound by theory, it is understood that the pigment dispersing agent covers a surface of the pigment so that cohesion between adjacent pigments may be inhibited.

Non-limiting examples of the dispersing agent include at least one selected from an alkylolammonium salt of a copolymer having acid groups, for example CAS No. 162627-23-8 (polyphosphoric acids, esters with 2-oxepanone-polyethylene glycol mono-methyl ether-tetrahydro-2H-pyran-2-one reaction product, compounds with 2-(dibutylamino)ethanol); an alkylammonium salt of a phosphoric acid ester of a copolymer; a copolymer containing phosphoric acid groups; a copolymer containing carboxylic acid groups; a polyester containing phosphoric acid groups; a poly(oxy(C1-C3)alkylene (C6-C32 alkyl ether, for example CAS No. 9002-92-0 (poly(oxyethylene)(4) lauryl ether); and the like.

Non-limiting commercially available examples of the dispersing agent may include BYK-200 (available from BYK-chemie, Germany), BYK-2001 (available from BYK-chemie, Germany), BYK-161 (available from BYK-chemie, Germany), BYK-163 (available from BYK-chemie, Germany), BYK-160 (available from BYK-chemie, Germany), BYK-161 (available from BYK-chemie, Germany), PD-7000 (trade name, available from CRODA, Germany), DFKA-4330 (trade name, available from BASF, Germany), DISPERS-650 (available from Evonik, Germany), and the like. These can be used alone or in a combination thereof.

When an amount of the dispersing agent is greater than about 1% by weight, based on the total weight of the photoresist composition, the dispersing agent in the photoresist composition may reduce an optical density of the composition. Thus, an amount of the dispersing agent in the composition may be equal to or less than about 1% by weight, based on the total weight of the photoresist composition.

(g) Sensitizer

The photoresist composition may further optionally include a sensitizer. The sensitizer serves to lower an activation energy of the photo initiator. The sensitizer may also increase light absorption of the photoresist composition. Thus, when the photoresist composition includes the photo initiator and the sensitizer, an amount of the photo initiator may be reduced by addition the sensitizer. In addition, eduction of the photo initiator may be substantially or effectively prevented. Furthermore, by varying the type and an amount of the multi-functional monomer and the mono-functional monomer, a photo margin of the photoresist composition may be improved, e.g., tuned, and consequently manufacturing costs may be reduced.

Non-limiting examples of the sensitizer may include at least one selected from diethylenethioxanthone ("DETX"), violanthrone, isoviolanthrone, fluoresceine, rubrene, 9,10-diphenylanthracene, tetracene, 13,13"-dibenzanthrone, and levulinic acid, and the like. These can be used alone or in a combination thereof.

An amount of the sensitizer may be about 10% by weight to about 30% by weight, based on a total weight of the photo initiator. When an amount of the sensitizer is less than about 10% by weight, based on the total weight of the photo initiator, very little increase in a photo margin of the photoresist composition may be observed. When an amount of the sensitizer is greater than about 30% by weight, based on the total weight of the photo initiator, a solubility of the photoresist composition may be decreased. An amount of the sensitizer in the photoresist composition may be about 10% by weight to about 30% by weight, based on the total weight of the photo initiator.

(h) Wavelength Shifter

The photoresist composition may further optionally include a wavelength shifter. The wavelength shifter may be added to the photo initiator and the sensitizer to improve the sensitivity of the photoresist composition with respect to a light having a peak wavelength range of the h-line.

Non-limiting examples of the wavelength shifter may include n-(2-phenyl-1,3-benzoxazol-5-yl)naphthalene-1-carboxamide, or 7-(diethylamino)-4-(trifluoromethyl)-2H-chromen-2-one, and the like. The foregoing compounds may be used either alone or in a combination with each other.

An amount of the wavelength shifter may be equal to or less than about 50% by weight with respect to an amount of the photo initiator.

(i) Additive

The photoresist composition may further optionally include an additive such as a surfactant or an adhesion enhancer. An amount of the additive may be equal to or less than about 1% by weight based on the total weight of the photoresist composition. When an amount of the additive is greater than about 1% by weight, certain characteristics of the photoresist composition may deteriorate.

(i-1) Surfactant

An example of the additive may include a surfactant. The surfactant may decrease interfacial tension between a substrate and a coated layer formed by curing the photoresist composition. Thus, addition of the surfactant may result in the coated layer uniformly formed on the substrate. Non-limiting examples of the surfactant may include FZ-2110 (trade name, available from Dow Corning, U.S), FZ-2122 (trade name, available from Dow Corning, U.S), BYK-345 (trade name, available from BYK, U.S), BYK346 (trade name, available from BYK, U.S), or BYK-34 (trade name, available from BYK, U.S), etc. The foregoing products may be used either alone or in a combination with each other.

(i-2) Adhesion Enhancer

The photoresist composition may optionally include an adhesion enhancer. When the substrate is a glass substrate, adhesion between the photoresist composition and the glass substrate may be improved by the adhesion enhancer. The adhesion enhancer may include at least one selected from a melamine cross-linking agent, a silane coupling agent having an organic functional group and an inorganic functional group.

Non-limiting examples of the silane coupling agent include KBM-303 (available from Shin-Etsu, Japan), KBM-403 (available from Shin-Etsu, Japan), KBE-402 (available from Shin-Etsu, Japan), or KBE-40 (available from Shin-Etsu, Japan), and the like. These can be used alone or in a combination with each other. Non-limiting examples of the melamine cross-linking agent may further include MW-30M (available from Vision Tech, Korea), MX706 (available from Vision Tech, Korea), and the like.

As stated above, the photoresist composition according to an exemplary embodiment may include a photo initiator activatable by light having a peak wavelength range of the h-line from about 400 nm to about 410 nm. As a result, certain optical characteristics of an exposure apparatus including a light source emitting a light corresponding to the h-line may be improved.

In another embodiment, the photoresist composition may include both the sensitizer and the wavelength shifter. In this embodiment, eduction of the photo initiator may be prevented, and a photoresist pattern having improved resolution may be formed.

In yet another embodiment, the photoresist composition may include both the cardo resin and the acrylic resin. In this embodiment, a photoresist pattern having a taper angle proper for a black matrix may be formed.

In still another embodiment, the photoresist composition may include both the surficial-portion initiator and the deep-portion initiator. In this embodiment, adhesion and reliability of a photoresist pattern may be improved.

The photoresist composition according to an exemplary embodiment may be suitable for forming a black matrix. However, the photoresist composition may also be used for forming a light-blocking layer for various electronic devices.

Hereinafter, a method of forming a black matrix using the photoresist composition according to the present disclosure will be described in further detail with reference to the accompanying drawings.

FIGS. 1 and 3-5 are cross-sectional views illustrating a method of manufacturing a black matrix and a display substrate according to an embodiment. FIG. 2 is a schematic view illustrating a digital light-exposure device used in an exposure process illustrated in FIG. 1.

Figure 1:
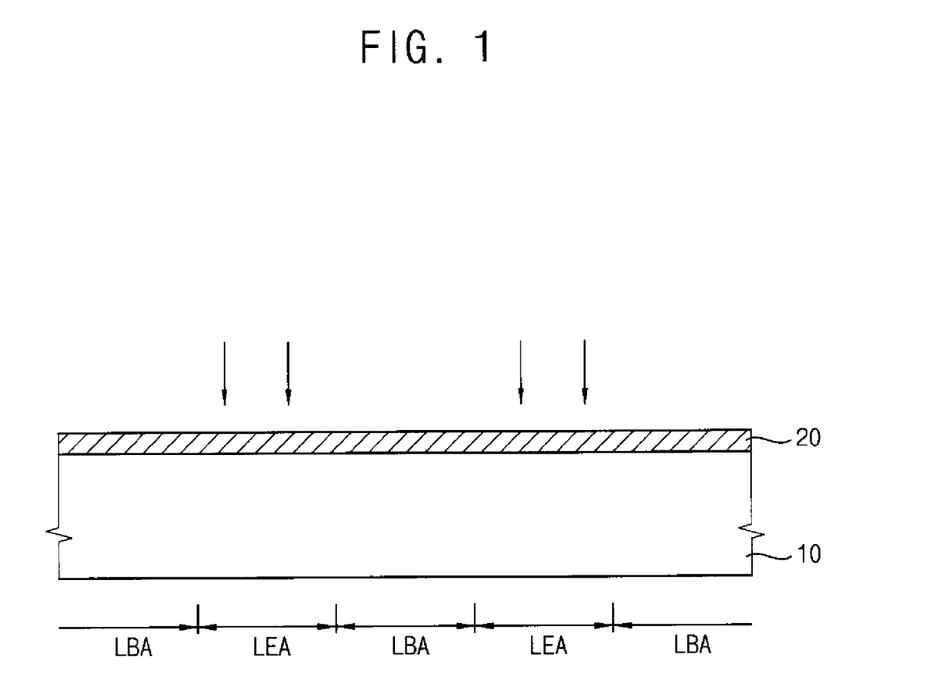
FIGS. 1 and 3-5 are cross-sectional views illustrating an embodiment of a method of manufacturing a black matrix and a display substrate.
Figure 2:
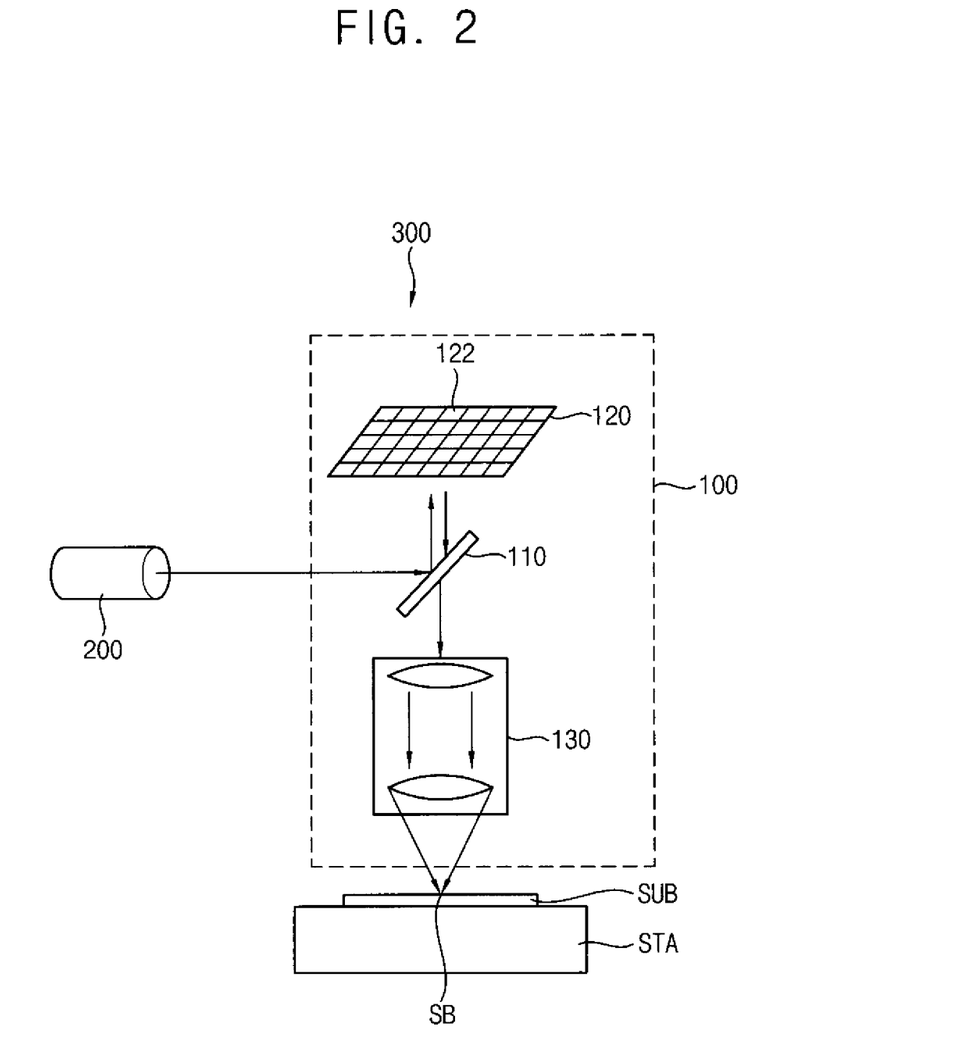
FIG. 2 is a schematic view illustrating an embodiment of a digital light-exposure device used in an exposure process illustrated in FIG. 1.

Referring to FIG. 1, a photoresist composition may be coated on a base substrate 10 to form a coated layer 20. Non-limiting examples of the base substrate 10 may include a glass substrate, a soda lime substrate, and the like.

The photoresist composition may include a binder resin, a photo-polymerization monomer, a photo initiator, a black-coloring agent, and a solvent. The photoresist composition may further include at least one of a dispersing agent, a sensitizer, a wavelength shifter, and an additive. The photoresist composition may be substantially the same as the photoresist composition described above. Thus, any duplicated explanation will be omitted here.

A dipping method, a spraying method, or a spin coating method, for example, may be used to form the coated layer 20. In an embodiment, the coated layer 20 may be pre-baked in order to at least partially remove the solvent in the photoresist composition.

Thereafter, the base substrate 10 having the coated layer 20 may be exposed to a light. In the process of exposing the coated layer 20 to the light, a light having a peak wavelength range of the h-line may be used. Specifically, a peak wavelength range of the h-line may be about 400 nm to about 410 nm, more specifically, about 405 nm. In an embodiment, the coated layer 20 may be exposed to a light by a digital light-exposure device 300, an embodiment of which is illustrated in FIG. 2 and which includes a light source emitting a light having a peak wavelength range of the h-line in order to avoid using a mask. The digital light-exposure device 300 may selectively determine an area where the light is provided and an area where the light is not provided. The digital light-exposure device 300 may not provide the light to a light blocking area LBA of the base substrate 10 and may provide the light to a light exposure area LEA without an additional mask being formed on the coated layer 20.

Referring to FIG. 2, the digital light-exposure device 300 may include a light source 200 generating a light, an optical head 100 provided with the light from the light source 200 and a stage STA provided with the light from the optical head 100. The base substrate, which is illustrated in FIG. 1 and has the coated layer 20, is disposed on the stage STA. In FIG. 2, the base substrate 10 having the coated layer 20 is indicated by "SUB" in FIG. 2.

The light source 200 may provide a laser beam having a peak wavelength range of the h-line to the optical head 100. As the light source 200 generates a light having a peak wavelength range of the h-line, micro-minors 122 of the optical head 100 may be prevented from being deteriorated and oxidized.

The optical head 100 may include a beam splitter 110, a digital micro-mirror device ("DMD") 120, and an optical system 130. Particularly, the beam splitter 110 reflects and transmits the laser beam that is provided from the light source 200. The laser beam reflected by the beam splitter 110 is provided to the DMD 120. A light provided by the DMD 120 is transmitted by the beam splitter 110, and then provided to the optical system 130.

The DMD 120 includes a plurality of micro-minors 122. The micro-mirrors 122 may be arranged to form m×n matrix shape. Each of the micro-mirrors 122 may reflect a light provided from the beam splitter 110. The DMD 120 may selectively reflect a light that is provided from the beam splitter 110 based on image data that is transcribed to the substrate SUB. The optical head 100 may further include a mirror control part (not shown). The mirror control part may control each of the micro-mirrors 122 based on the image data. The mirror control part may also output a signal controlling an on/off mode of the micro-mirrors 122.

The optical system 130 may include a plurality of lenses. The optical system 130 may serve to change the direction of the reflection beams that are incident from the DMD 120 into a plurality of spot beams SB. The optical system 130 may condense the reflection beams that are incident from the DMD 120 and may expand a distance between the reflection beams.

Accordingly, the coated layer 20 formed on the base substrate 10 is not provided with a light in the light blocking area LBA, and is provided with a light in the light exposure area LEA.

Figure 3:
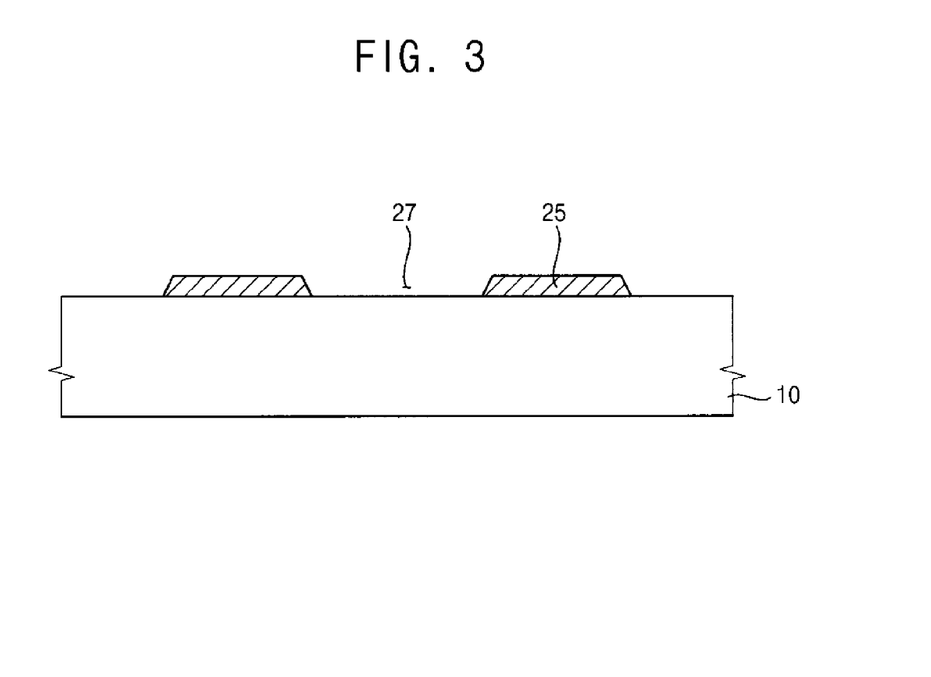

Referring to FIG. 3, a portion of the coated layer 20, which is not provided with a light, may be removed to form a black matrix 25.

For example, when a developer such as an alkali solution is provided to the coated layer 20, the coated layer 20 in the light exposure area LEA remains on the base substrate 10, and the coated layer 20 in the light blocking area LBA is dissolved by the developer. Accordingly, the coated layer 20 may be removed from the base substrate 10. As a result, the black matrix 25 may be formed by a remaining coated layer. The developer may be provided through a dipping method, a spraying method, or the like.

In an embodiment, after the coated layer 20 in the light blocking area LBA has been removed, the black matrix 20 may be post-baked to enhance adhesion.

The black matrix 25 may include a first stripe pattern extending in a first direction on the base substrate 10, and a second stripe pattern extending in a second direction crossing the first direction thereby defining a plurality of openings 27 arranged in a matrix configuration.

Figure 4:
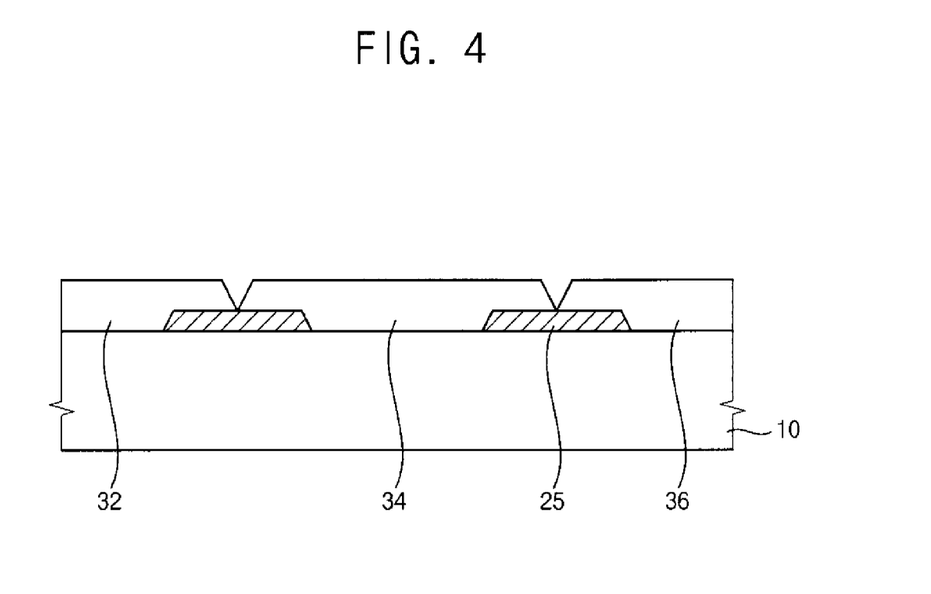

Referring to FIG. 4, a color filter may be formed on the base substrate 10 having the black matrix 25. The color filter may fill the openings defined by the black matrix 20 and may overlap with at least a portion of the black matrix 25.

The color filter may include a plurality of color filters having different colors. For example, the plurality of color filters may include a first color filter 32 having a red pigment, a second color filter 34 having a green pigment, and a third color filter 36 having a blue pigment. The first, second, and third color filters 32, 34 and 36 may respectively be formed from photoresist compositions which are different from each other.

In an embodiment, a first photoresist composition including a red pigment may be coated on the base substrate 10, and then exposed to a light and developed to form the first color filter 32. Subsequently, a second photoresist composition including a green pigment may be coated on the base substrate 10, and then exposed to a light and developed to form the second color filter 34. Furthermore, a third photoresist composition including a blue pigment may be coated on the base substrate 10, and then exposed to a light and developed to form the third color filter 36. The first to third color filters 32, 34 and 36 may partially overlap with each other.

The first to third color filters 32, 34 and 36 may be formed by consequently irradiating the photoresist composition including an appropriate pigment with a digital light-exposure device or a conventional light-exposure device using a mask.

Figure 5:
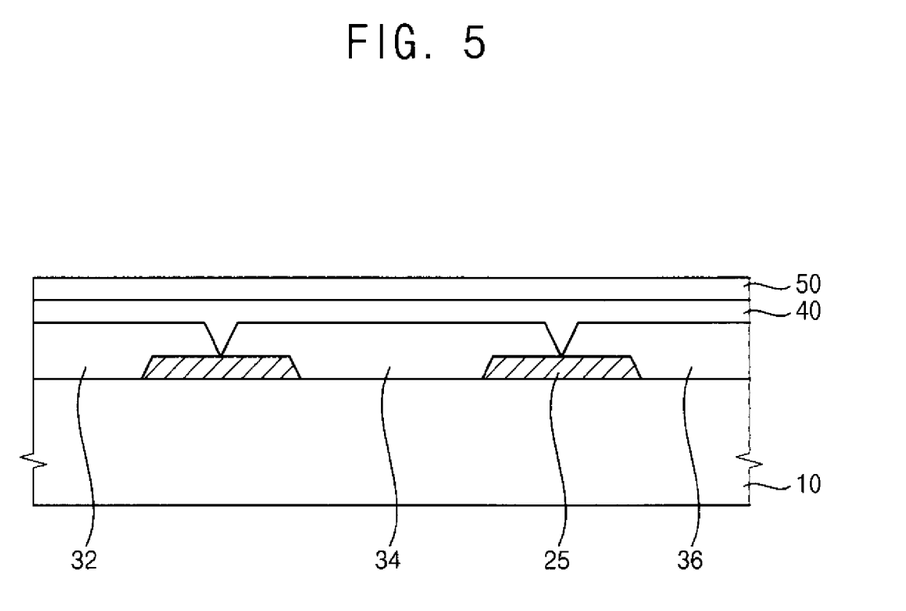

Referring to FIG. 5, a planarizing layer 40 and a transparent electrode 50 may be formed to cover the color filters. The planarizing layer 40 may compensate for a step due to the color filters to planarize the base substrate 10. The transparent electrode 50 may be formed on the planarizing layer 40, wherein the transparent electrode 50 may function as a common electrode.

In an embodiment, the planarizing layer 40 may include an organic insulation layer including an acrylic resin, a phenol resin, a polyimide resin, or the like. The transparent electrode 50 may include at least one selected from indium tin oxide ("ITO"), and indium zinc oxide ("IZO"), and the like.

According to the above, a black matrix and a display substrate may be manufactured by using a digital light-exposure device and a photoresist composition appropriate for the digital light-exposure device.

In an embodiment, the black matrix may be formed with the color filter and the common electrode on a same substrate. In another embodiment, at least one of the color filter and the common electrode may be omitted. Alternatively, the black matrix may be formed on an array substrate including a thin film transistor array.

It will be apparent to those skilled in the art that various modifications and variation can be made in the present embodiment without departing from the spirit or scope of the disclosure. Thus, it is intended that the present disclosure cover the modifications and variations of these embodiments provided they come within the scope of the appended claims and their equivalents.

What is claimed is:

1. A photoresist composition, comprising:
   about 5% by weight to about 10% by weight of a binder resin;
   about 5% by weight to about 10% by weight of a photo-polymerization monomer;
   about 1% by weight to about 5% by weight of a photo initiator, which is activated by a light having a peak wavelength from about 400 nanometers to about 410 nanometers, the photo initiator comprising at least one surficial-portion initiator selected from a bis(acyl)phosphine compound, a metallocene compound, a monoacylphosphine compound, and an α-hydroxyketone compound;
   about 5% by weight to about 10% by weight of a black-coloring agent, each based on a total weight of the photoresist composition;
   about 10% by weight to about 30% by weight of a sensitizer, based on a total weight of the photo initiator, the sensitizer comprising at least one selected from diethylenethioxanthone, violanthrone, isoviolanthrone, fluoresceine, rubrene, 9, 10-diphenylanthracene, tetracene, 13,13"-dibenzanthrone, and levulinic acid;
   equal to or less than about 50% by weight of a wavelength shifter, based on a total weight of the photo initiator, wherein the wavelength shifter is N-(2-phenyl-1,3-benzoxazol-5-yl)naphthalene-1-carboxamide; and
   a solvent.

2. The photoresist composition of claim 1, wherein the binder resin comprises an acrylic resin and a cardo resin.

3. The photoresist composition of claim 2, wherein a weight-average molecular weight of the acrylic resin is about 3,000 to about 50,000 Daltons, and wherein the acrylic resin is a product of polymerization of at least one selected from methacrylic acid, acrylic acid, crotonic acid, maleic acid, vinyl pyrrolidone, styrene monomer, methyl methacrylate, benzyl methacrylate, 2-hydroxyethyl methacrylate, an aryl methacrylate, and glycidyl methacrylate.

4. The photoresist composition of claim 2, wherein a weight-average molecular weight of the cardo resin is about 3,000 to about 10,000 Daltons, and wherein the cardo resin comprises a ring structure represented by Chemical Formula 1, Chemical Formula 1 wherein "*" represents a point of attachment to the neighboring groups of the cardo resin.

5. The photoresist composition of claim 2, wherein a weight ratio of the cardo resin to the acrylic resin is about 8:2 to about 5:5.

6. The photoresist composition of claim 1, wherein the photo-polymerization monomer comprises at least one selected from dipentaerythritol hexaacrylate, pentaerythritol triacrylate, pentaerythritol tetraacrylate, trimethylpropane triacrylate, trimethylpropane trimethacrylate, glycerol triacrylate, tris(2-hydroxyethyl)isocyanurate triacrylate, di-trimethylpropane tetraacrylate, dipentaerythritol pentaacrylate, pentaerythritol tetraacrylate, glycidyl methacrylate, hydroxyethyl methacrylate, 2-hydroxy-3-phenoxypropyl acrylate, diethylene glycol methyl ether methacrylate, hydroxyethyl acrylate, butyl methacrylate, hydroxypropylacrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, and tridecyl acrylate.

7. The photoresist composition of claim 1, wherein the photo initiator comprises at least one selected from phenyl-bis(2,4,6-trimethylbenzoyl)phosphine oxide, diphenyl(2,4,6-trimethylbenzoyl)phosphine oxide, 2-hydroxy-2-methyl-1-phenyl-1-propanone, and bis(η5-2,4-cyclopentadien-1-yl)-bis[2,6-difluoro-3-(1H-pyrrol-1-yl)phenyl]titanium.

8. The photoresist composition of claim 1, wherein the photo initiator further comprises a deep-portion initiator comprising an acetophenone compound.

9. The photoresist composition of claim 8, wherein a weight ratio of the at least one surficial-portion initiator to the deep-portion initiator is about 7:3 to about 5:5.

10. The photoresist composition of claim 1, wherein the black-coloring agent comprises at least one selected from carbon black, titanium black, acetylene black, aniline black, perylene black, strontium titanium oxide, chromium oxide, and ceria.

11. The photoresist composition of claim 1, further comprising equal to or less than about 1% by weight of a dispersing agent, based on a total weight of the photoresist composition.

12. The photoresist composition of claim 1, further comprising an additive, wherein an amount of the additive is equal to or less than about 1% by weight, based on a total weight of the photoresist composition, and wherein the additive comprises at least one selected from a surfactant and an adhesion enhancer.

* * * * *